United States Patent [19]

Tazima

[11] Patent Number: 4,974,057
[45] Date of Patent: Nov. 27, 1990

[54] SEMICONDUCTOR DEVICE PACKAGE WITH CIRCUIT BOARD AND RESIN

[75] Inventor: Akira Tazima, Beppu, Japan

[73] Assignee: Texas Instruments Incorporated, Dallas, Tex.

[21] Appl. No.: 296,392

[22] Filed: Jan. 9, 1989

Related U.S. Application Data

[62] Division of Ser. No. 113,687, Oct. 26, 1987, abandoned.

[30] Foreign Application Priority Data

Oct. 31, 1986 [JP] Japan .................. 61-259997
Oct. 31, 1986 [JP] Japan .................. 61-259998
Oct. 31, 1986 [JP] Japan .................. 61-259999

[51] Int. Cl.[5] .......................................... H01L 23/28
[52] U.S. Cl. ........................... 357/72; 357/70; 357/54; 357/80; 357/69; 357/74; 357/75; 174/52.2
[58] Field of Search ............... 357/54, 72, 69, 70, 357/75, 76, 71, 68, 80, 81, 74; 174/52.2

[56] References Cited

U.S. PATENT DOCUMENTS

| | | | |
|---|---|---|---|
| 3,611,317 | 10/1971 | Bonfeld .................. | 357/75 |
| 3,893,156 | 7/1975 | Riseman .................. | 357/70 X |
| 4,122,479 | 10/1978 | Sugawara et al. ........ | 357/75 X |
| 4,147,889 | 4/1979 | Andrews et al. ......... | 357/70 X |
| 4,396,457 | 8/1983 | Bakermans .............. | 357/75 X |
| 4,774,635 | 9/1988 | Greenberg et al. ...... | 357/70 X |
| 4,785,137 | 1/1988 | Samuels ................. | 357/75 X |
| 4,788,583 | 11/1988 | Kawahara et al. ....... | 357/70 X |

FOREIGN PATENT DOCUMENTS

| | | | |
|---|---|---|---|
| 2735232 | 2/1979 | Fed. Rep. of Germany ... | 357/75 X |
| 52-58469 | 5/1977 | Japan .................. | 357/72 X |
| 56-24955 | 3/1981 | Japan .................. | 357/75 X |
| 58-158955 | 9/1983 | Japan .................. | 357/75 X |
| 59-188947 | 10/1984 | Japan .................. | 357/72 X |
| 59-202855 | 11/1984 | Japan .................. | 357/72 X |
| 60-160145 | 8/1985 | Japan .................. | 357/72 X |
| 61-87246 | 4/1986 | Japan .................. | 357/72 X |
| 61-137349 | 6/1986 | Japan .................. | 357/72 X |
| 61-168943 | 7/1986 | Japan .................. | 357/72 X |
| 63-124450 | 5/1988 | Japan .................. | 357/75 X |
| 2117564 | 10/1983 | United Kingdom ...... | 357/75 X |

OTHER PUBLICATIONS

Bodendorf et al, "Active Silicon Chip Carrier", *IBM Technical Disclosure Bulletin*, vol. 15, No. 2, Jul. 1972, pp. 656-657.

Dion et al, "Module Package", *IBM Technical Disclosure Bulletin*, vol. 7, No. 7, Dec. 1964, p. 557.

Farrell et al, "Protective Coating for Devices on Encapsulated Modules", *IBM Technical Disclosure Bulletin*, vol. 8, No. 12, May 1966, p. 1705.

*Primary Examiner*—William Mintel
*Attorney, Agent, or Firm*—William E. Hiller; N. Rhys Merrett; Melvin Sharp

[57] ABSTRACT

A semiconductor device package having a semiconductor element of elements sealed in resin wherein a plurality of resin types different in function are used for sealing in which the more expensive resins are selectively used in forming thin covering layers for the semiconductor element and other components of the device, and the less expensive resin is used in a larger amount as an outer cover of a molded package. In another aspect of the semiconductor device package, bonding pads are provided at least in the active region of the semiconductor element or elements for wireless bonding of the semiconductor element to a circuit board. A stacked type semiconductor device package is also proposed wherein a plurality of semiconductor devices are stacked one atop the other, at least one of which has outer leads of longer length than the outer leads of the other semiconductor devices.

13 Claims, 11 Drawing Sheets

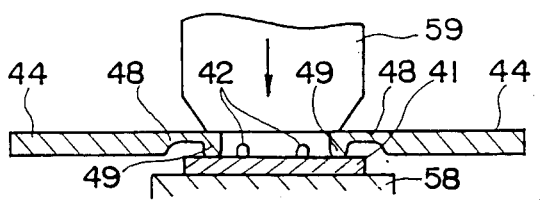
FIG.15A
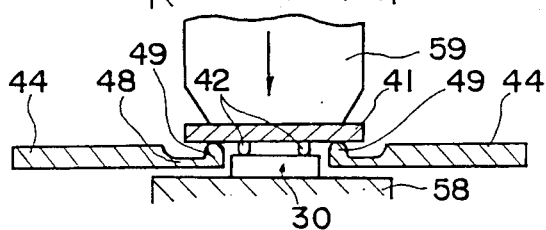
FIG.15B
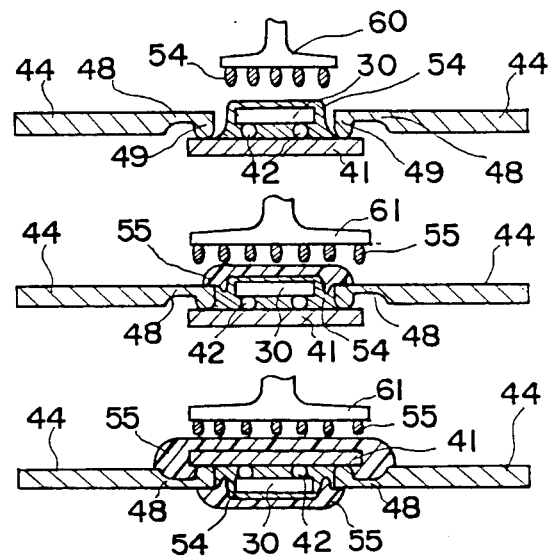
FIG.15C
FIG.15D
FIG.15E
FIG.15F (A)

(B)

SEMICONDUCTOR DEVICE PACKAGE WITH CIRCUIT BOARD AND RESIN

This application is a division of application Ser. No. 113,687, filed Oct. 26, 1987, now abandoned.

BACKGROUND OF THE INVENTION

1. Field of the Invention

This invention relates to a semiconductor device package.

2. Description of the Prior Art

Technology making free use of the thin film or thick film process, molding in resin for sealing, bonding, etc. is known for the assembly of various semiconductor device packages. Such assembly technology has however many problems as mentioned below that remain to be solved. Problem 1

The hybrid integrated circuit (hereinafter abbreviated "HiC") of prior art primarily relies on the thick film process in that a circuit is formed on a board made of a ceramic or other material, for example, by offset printing and a semiconductor element is packaged thereon as a general package, such as the SOP (small outline package) or FLP (flat package)., or flip chip (C.0.B.), TAB, or the like with R, (resistor) C, (capacitor) and other circuit chip parts packaged on the same board. With the thick film process, it is technically difficult to achieve fine and dense circuit fabrication, however, it has been impossible to integrate the circuit to a high density. Furthermore, depending on circuit type, it is sometimes necessary to treat the whole or part of the circuit board with resin by coating or potting, which causes problems of lower productivity and less reliability. Problem 2

On the other hand, the HiC packaged by the thin film process can achieve a high circuit density though only by applying a packaging technique of high reliability. This means very expensive costs. Problem 3

In case of a HiC of prior art which is transfer molded to have a resin-sealed package, for example, referring to FIG. 1, a printed circuit board 1 is secured on a lead frame 2 and a semiconductor element 3 is mounted thereon, which is then wired with bonding wires 4 to the circuit printed on the board 1. This circuit is further wired with bonding wires 5 for electrical connection to outer leads 6. The whole assembly is then sealed in a resin mold 7. With a large circuit board size of the board 1, however, the standard package design of prior art is subject to cracks securing in the resin and other problems caused by stresses resultant from interactions between the sealing resin 7, lead frame 2, and board 1. Another problem of such a package is deterioration in moistureproof performance due to much more proximity of the inside of the HiC to the outer environment thereof compared to the conventional standard IC. Problem 4

Application oriented semiconductor device packages, for example, HiCs as mentioned in the above Problems 1 and 2, are produced in small lots in many versions, so these devices have a problem that efficient production cannot be accomplished therewith, making it difficult to achieve any essential cost reduction. Problem 5

The resin-sealed package, as shown in FIG. 1, provided by the transfer mold process has a problem of the deformation on molding, for example, of the lead wires. To avoid this, it is necessary to use a lower molding pressure, which has a disadvantage in that the resin cannot pack at high density, resulting in poor sealing and deterioration of the package in moistureproof performance. Problem 6

The so-called "beam lead" bonding method in face-up position, which connects the semiconductor element to beam leads fabricated by etching copper foil stuck to plastic tape, for example, made of polyimide, or a blank copper sheet, results in very expensive costs when used for production of application oriented semiconductor device packages produced in small lots in many versions. Further, the nature of the plastic material of which the tape is made is such that it is difficult to satisfactorily seal the assembled device in resin by the transfer mold process. For high reliability, therefore, the device is sealed in resin otherwise, for example, by screen printing or potting. Furthermore, after packaging onto the board, the outer leads for connection to external terminals, being mechanically weak, require coating, etc. The total packaging cost thus becomes expensive. Problem 7

With know semiconductor device packages that are sealed in resin by the transfer mold process, cracks in the mold resin and/or damages on the semiconductor element are often encountered under stresses produced by interactions between resin, lead frame, semiconductor element, etc. Particularly, this is encountered when copper alloy is used for the material of the lead frame. These stresses also cause a problem in that aluminium leads may be deformed from the semiconductor element. Further, the concentration of stresses along the interface between resin and lead frame results in separation of resin 7 from the lead frame 6. As a result, moisture and halide ions may penetrate through a gap along the interface from the open end thereof causing troubles, for example, the corrosion of aluminium leads from the semiconductor element. Problem 8

The plastic material of prior art used for sealing is expensive since only a single type of resin (with high electrical insulation, high moistureproof performance, high thermal conductivity, low stresses, etc.) is used for sealing a semiconductor device in resin by the transfer mold process to achieve the necessary performances as a hermetic package. Problem 9

With the wire bonding design as shown in FIG. 1, including a case where the semiconductor element is directly connected to the outer leads by wire bonding, it is necessary to secure irreducible minimum areas (primarily those corresponding to bonding pads 8, see FIG. 2) on the semiconductor element around the active element region thereof to bond wires made of Au, Al, Cu or the like thereto. This places restrictions on efforts to achieve a high density of circuit integration. It is noted that FIG. 2 illustrates a smaller number of pads 8 than would be the case in ordinary practice to facilitate an easier understanding of how the bonding pads are disposed on the semiconductor element 3. In addition, the resin-sealed package provided by the transfer mold process is subject to the deformation of the wires by the resin molding, such that a lower molding pressure must be used in such a mold process for avoiding the wire deformation problem. Under a lower molding pressure, however, resin cannot pack at high density for complete sealing. This results in inferior moistureproof performance. The application oriented semiconductor device or the like typically requires a large number of connections, so the wire bonding approach may contribute to inferior productivity. Ordinarily, it takes 0.1 to 0.2 sec to bond a wire to a pad. Accordingly, the bonding time to establish, for example, one hundred connections is 10 to 20 sec. Further, an additional time is needed, for example, for positioning. The semiconductor element, etc. might thus be affected adversely. Problem 10

By the face-down bonding approach, called "flip chip technique", a semiconductor element 10 with bump electrodes 9 is connected to a board 11 as shown in FIGS. 3 and 4. In this case, interactions between the semiconductor element 10 and board 11, for example, due to heating give rise to stresses that concentrate at bumps, sometimes causing troubles, such as a connection failure. Solder (Sn-Pb alloy) is typically used as the material of these bumps 9 since this material not only makes positioning on bonding easier but allows reflow bonding. In FIG. 4, a silicon chip 12 has an aluminium circuit 13 connected to an aluminium lead 14 with a bump formed at one end thereof by laminating a plated chromium layer 15, plated nickel layer 16, plated copper layer, 17 and top, solder or gold layer 18 successively. The silicon chip 12 further has a surface oxide film 19, intermediate insulating layers 20 and 21, and an overcoat layer 22 disposed thereon. To avoid any possible troubles that may result from stresses, a bump configuration as shown in either (A) or (B) of FIG. 5 is used. With such a bump configuration, however, the transfer mold process is not applicable because the molding temperature and other aspects of the transfer mold process adversely affect the integrity of the completed package to a significant degree. A special packaging technique that involves very expensive costs thus becomes necessary. Problem 11

If the package structure as shown° -in FIG. 1 is , adopted for the semiconductor element, the semiconductor device package will be limited to a relatively small number of pins (outer leads). Therefore, in order to have various modifications of the basic functional operations of the semiconductor element, different semiconductor devices may be necessary.

OBJECTS AND SUMMARY OF THE INVENTION

Accordingly, it is an object of this invention to provide a semiconductor device package that substantially avoids any of the major problems as described herein, is reliable and can be fabricated rapidly at low cost.

It is another object for a semiconductor element having a the invention to provide a semiconductor device package of higher degree of circuit integration density.

It is still another object of the invention to provide a semiconductor, device package which has a package structure readily enabling the number of available pins to be increased to adapt the semiconductor device package to various applications.

Namely, the invention is concerned with a semiconductor device package comprising a semiconductor element or elements and an accompanying circuit sealed in resin in which the semiconductor element or elements and the accompanying circuit are coated with a plurality of resin types having different functions in providing the resin-sealed package.

Further, the invention is directed to a semiconductor device package having bonding pads preferably in matrix configuration at least in the active region of the semiconductor element or elements for wireless bonding (particularly as flip chips for face-down bonding).

Still further, the invention concerns a semiconductor device package wherein two or more semiconductor devices are stacked and at least one of such semiconductor devices has longer outer leads than the other semiconductor device or devices in the stack.

According to a preferred embodiment of the invention, a resin-sealed application oriented semiconductor device package is provided which comprises a circuit board and a plurality of miniature semiconductor elements connected to the circuit board in face-down configuration wherein the circuit board made of the same sort of semiconductor material as the miniature semiconductor elements has additional resistors, capacitors, etc. formed by the ordinary process of semiconductor element fabrication, instead of the thick or thin film technology as heretofore applied, with bump electrodes added thereto. This approach enables a higher degree of circuit integration to be achieved and provides a semiconductor device package with improved performance. Since the semiconductor elements are made of a semiconductor material of the same sort as the circuit board, the bump electrodes are subject to less stress and thereby are less affected in an adverse manner.

Further conductive bumps are formed on the conventional lead frame, which allow direct connection from the lead frame to the circuit board without requiring any bonding wire. Further, a package design where the semiconductor device assembled as above-described is coated (for example by potting) with a plurality of different resin types having different functions allows use of an inexpensive resin to be used in the transfer mold process for satisfactory sealing. The package thus fabricated performs as satisfactorily as the ordinary FLP type semiconductor device package or the like.

Other objects, features and advantages of the invention will appear more fully from the following detailed description thereof taken in connection with the accompanying drawings.

BRIEF DESCRIPTION OF THE DRAWINGS

Thus, FIG. 1 is a cross sectional view of a conventional semiconductor device package showing a semiconductor element having bonding wires connected to a circuit board which is connected to outer leads by additional bonding wires, with molded resin encasing the semiconductor element, the circuit board, and the wires.

FIG. 2 is a perspective view of a semiconductor element which may be a component of the conventional semiconductor device package of FIG. 1.

FIG. 3 is a diagram showing the method of face-down bonding.

FIG. 4 is a cross sectional view illustrating a major portion of a semiconductor element involved in face-down bonding procedure such as shown in FIG. 3.

FIG. 5 (A) and (B) are two diagrams respectively illustrating practically applicable bump configurations.

FIGS. 6 through 25 refer to examples of semiconductor device packages embodying various aspects of this invention.

Thus, FIG. 6 is a cross section of a semiconductor device package wherein miniature semiconductor elements are mounted on a hybrid circuit board and sealed in resin.

FIG. 7 is a perspective view of a hybrid circuit board.

FIG. 8 is a perspective view of two miniature semiconductor elements mounted on the hybrid circuit board of FIG. 7.

FIG. 9 is a perspective view of a miniature semiconductor element.

FIG. 10 is an expanded cross section of an important region of the miniature semiconductor element of FIG. 9.

FIGS. 11 (A), (B) and (C) are plan views of a lead frame at major sequentially occurring assembly steps FIGS. 12 (A) and (B) are respectively an enlarged front view and a plan view of a beam lead portion of a lead frame.

FIG. 13 (A) is a cross section of part of another lead frame material, and FIGS. 13 (B) and (C) are cross sections of the lead frame material of FIG. 13(a) following two major steps of lead frame fabrication.

FIG. 14 is a partial cross section of a resin-sealed semiconductor device package showing a possible condition at the interface between the sealing resin and the lead frame.

FIGS. 15 (A) through (F) are cross sections of a semiconductor device showing major steps of a semiconductor device packaging process in the sequential order in which they occur.

FIG. 16 is a perspective view of a carrier tape as wound upon a reel and having different semiconductor device package products attached for shipment.

FIG. 17 is a partial cross section of another semiconductor device package.

FIG. 18 is a perspective view of a stacked type semiconductor device package.

FIG. 19 is an exploded perspective view of two separate semiconductor devices that can be stacked to provide the stacked type semiconductor device package of FIG. 18.

FIG. 20 is a front view of the semiconductor device package of FIG. 18.

FIGS. 21 and 22 are front views of other respective stacked type semiconductor device packages.

FIG. 23 is a partial front view of yet another stacked type semiconductor device package.

FIG. 24 is an exploded perspective view of two separate semiconductor devices that can be stacked to provide another stacked type semiconductor device package.

FIG. 25 (A) is an exploded perspective view of two separate semiconductor devices that can be stacked to provide another stacked type semiconductor device package.

FIG. 25 (B) is a plan vie of the stacked type semiconductor device package of FIG. 25 (A).

DESCRIPTION OF THE PREFERRED EMBODIMENTS

Figure 6:
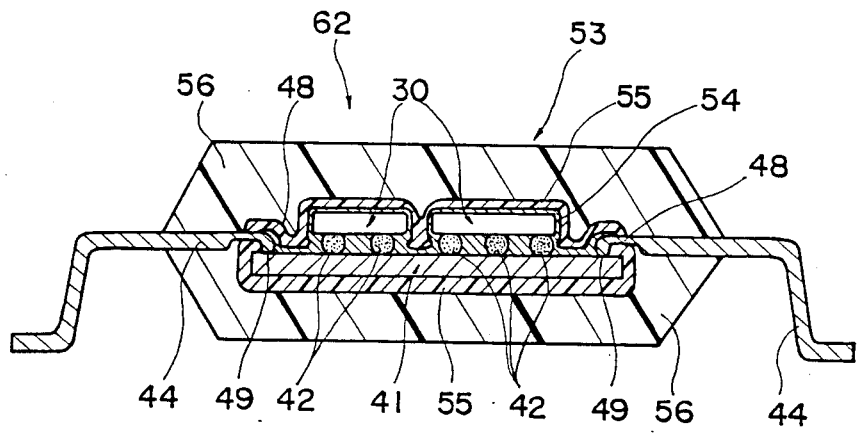
Figure 7:
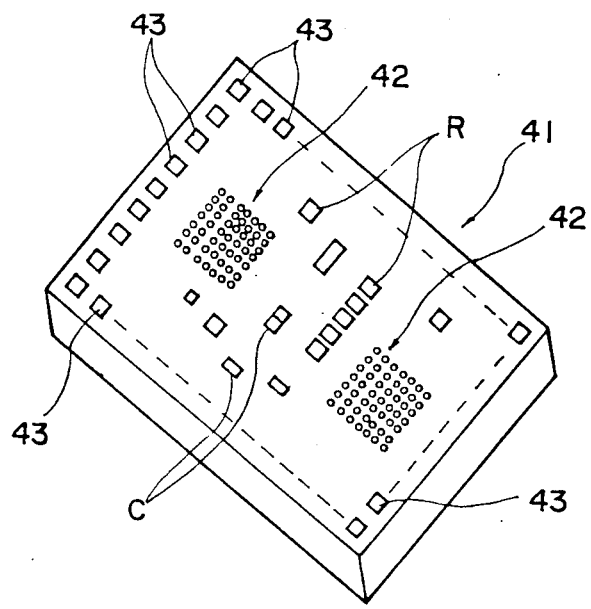

A first example of a semiconductor device package embodying the invention and having a resin-sealed package construction is shown in FIG. 6 where miniature semiconductor elements 30 are packaged by mounting on a board 41. On the board 41 on which the semiconductor elements 30 are to be mounted, resistors R, capacitors C, etc., and additional circuit components that are necessary to provide a particular application oriented semiconductor device package are prefabricated as shown in FIG. 7 by applying the conventional techniques of semiconductor device fabrication (namely, impurity diffusion, oxide film formation, etc.). Accordingly, resistors, capacitors, etc. can readily be fabricated to produce the board 41 at a high yield, even with the use of a special material (for example, a material having a high dielectric constant), that has hitherto been unattainable. This approach to a solution of the problem of how to achieve circuit integration at high density by the conventional thick/thin film technique. Further, if the board 41 is made of the same sort of semiconductor material as the miniature semiconductor elements 30 that are disposed on such board 41, possible troubles that may occur at the connections, for example, one as mentioned above in Problem 7 can all be solved.

Beside resistors, capacitors, etc. formed as mentioned above, the board 41 is provided with bump electrodes 42 in given areas to allow electrical connection of the miniature semiconductor elements 30. Such bump electrodes may be formed, according to the ordinary practice, by depositing gold. Further, electrodes 43 are provided along the edges of board 41 for electrical connection to beam leads. In the present example, these electrodes 43 are disposed at pitches of 300$\mu$m. The surfaces of these electrodes are metallized with gold or copper to avoid exposure of the aluminium material and thereby improve the moistureproof performance.

Figure 8:
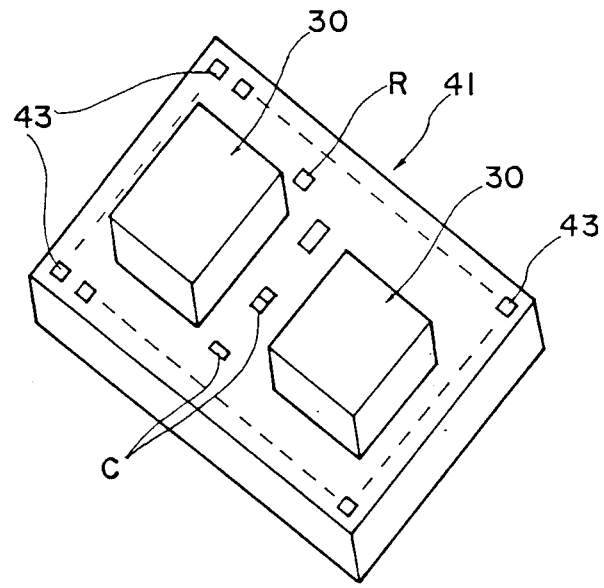

The miniature semiconductor elements 30 are bonded to the hybrid circuit board 41 in the face-down configuration as shown in FIGS. 6 and 8. Unlike the conventional practice, however, the semiconductor elements 30 have no bump electrode formed thereon. This means these semiconductor elements 30 are free from any adverse effect that might have been exerted at the bump electrode formation step, for example, a connection failure due to excessive stresses. In addition, a design that connection electrodes 31 on each semiconductor element 30 are disposed in some standard layout, for example, in a matrix of 100$\mu$m squares at pitches of 200$\mu$m will improve productivity while allowing more uniform positioning of the connection electrodes 31 and thereby preVenting excessive stress concentration that may affect electrical connection.

Figure 1:
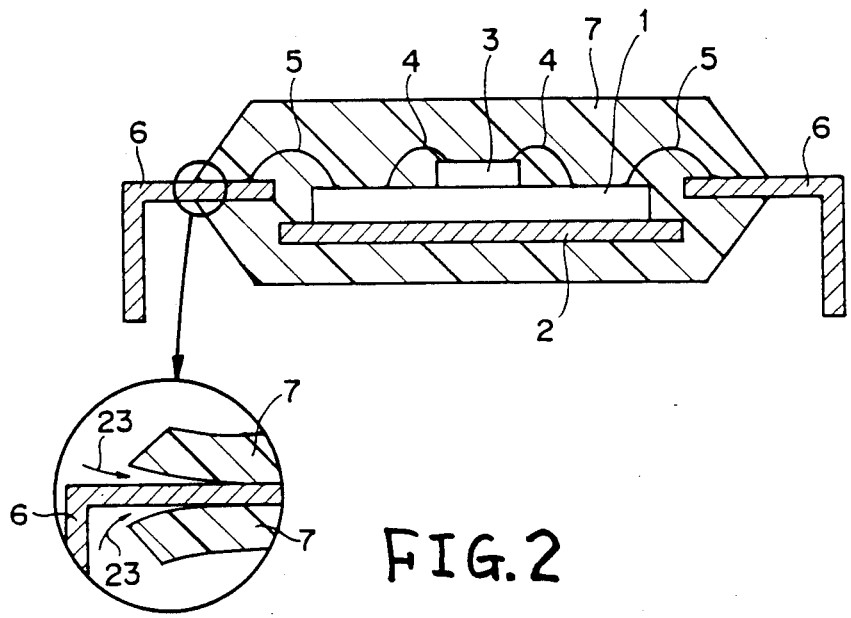
FIGS. 1 through 5 refer to respective aspects of semiconductor device packages known in the prior art.
Figure 2:
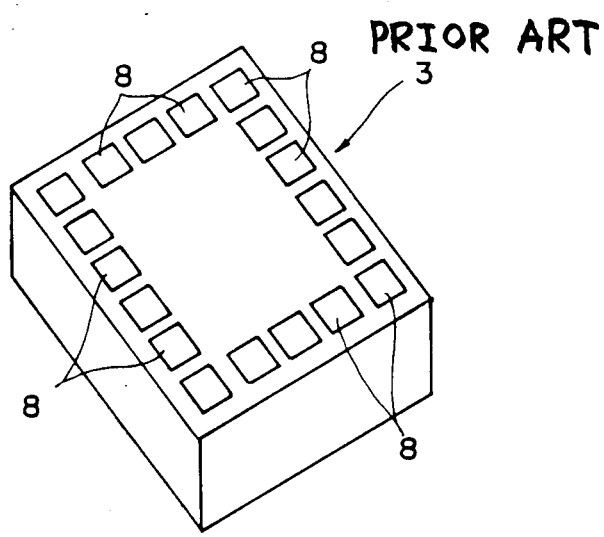
Figure 3:
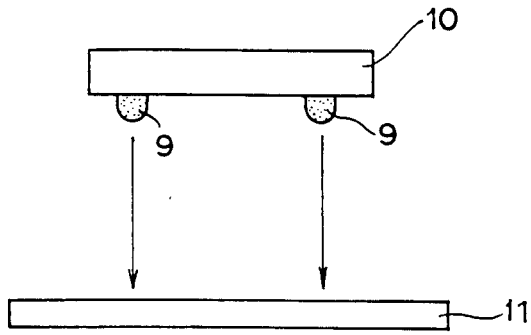
Figure 4:
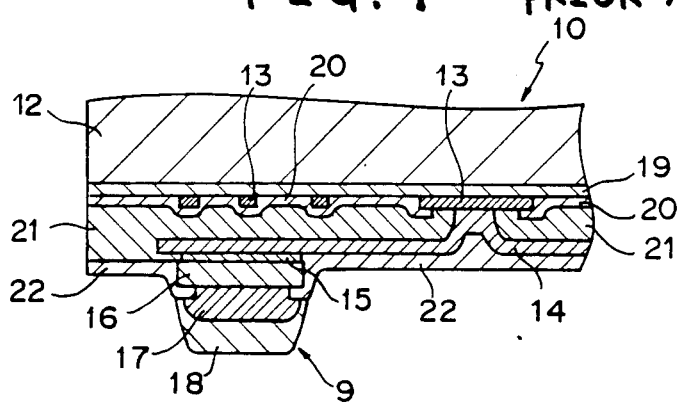
Figure 5:
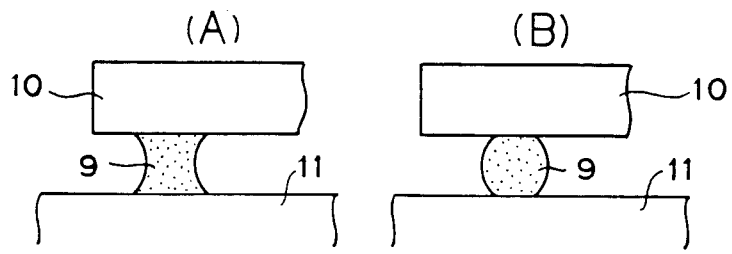
Figure 9:
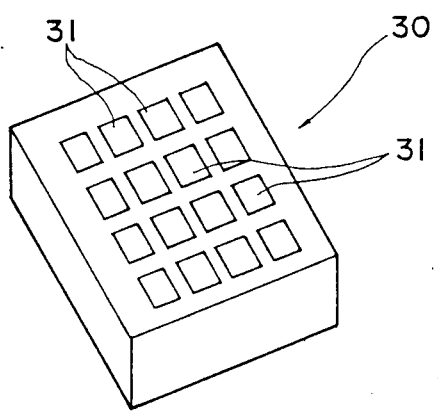
Figure 10:
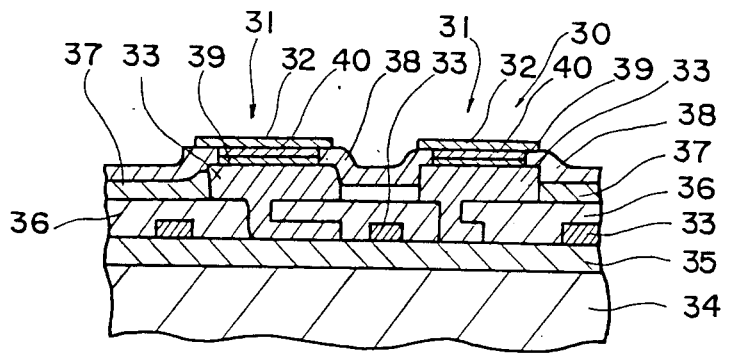

Unlike the prior art semiconductor element (see FIG. 2) provided with wireless bonding areas along the edges thereof, the semiconductor element 30 in the above example which is intended for face-down wireless bonding as a flip chip has electrodes or bonding pads 31 arranged in the active element region in the form of matrix wired by a multi-layer wiring construction as shown in FIGS. 9 and 10. It is noted that though in FIG. 9 a rather limited number of pads 31 are shown to simplify the illustration, actually many more pads 31 can be added, as necessary.

With bonding pads formed in the active region of the semiconductor element, the necessary area for such pads can effectively be obtained on the semiconductor element without specifically providing a dedicated area on the semiconductor element for such pads, thereby enabling a higher degree of circuit integration on a chip size of reduced area.

Further, the surfaces of electrodes 31 are coated with a tin or copper layer 32 to prevent exposure of the underlying aluminum layer 33. With the above construction, the, resin-sealed semiconductor device package exhibits an improved moistureproof performance that has hitherto been one of the weak points of this type of semiconductor device package. It is noted that in FIG. 10, a silicon substrate 34 which may serve as a circuit board has an oxide film 35 disposed on the surface thereof, with interlayer insulating films 36, 37, overcoat 38, chromium film 39 and nickel,.or copper film 40 being provided above the oxide film 35.

Referring to the resin-sealed package construction of FIG. 6, resin seal 53 is characterized by a functionally divided layered construction primarily comprising a moistureproof resin layer, a low stress resin layer, and an inexpensive resin layer. Namely, to provide a resin-sealed semiconductor device package of high reliability and low cost, an approach is used in which relatively expensive resins, such as a moistureproof resin and a low stress resin, are applied as thin and uniform layers for reduction of the production cost per unit of the semiconductor device package. An expensive resin can then be applied as a thick layer in a larger amount to complete the package. In the example of FIG. 6, after a layer 54 of moistureproof resin (or low stress resin) is provided by coating the surfaces of the semiconductor elements 30, for example, with epoxy resin (or silicone resin) 75μm thick on average, a layer 55 of low stress resin (or moistureproof resin) is then provided by further coating with silicone resin (or epoxy resin) 100μm thick on average, and hereafter a layer 56 composed of inexpensive resin is formed by applying epoxy resin containing silica by the transfer mold process. Thus, instead of sealing from which outer leads extend a single type of resin, a plurality of resin types that differ in function but fulfill all desirable functions if used, in combination for sealing as in the above example to provide a semiconductor device package of high reliability at low cost.

In the above example of the application oriented semiconductor device package, most of the requirements imposed by the user can be provided while other parts may be standardized. The semiconductor device package can thus be fabricated fast at low cost.

In the above example, other parts of the semiconductor device package are characterized as follows.

First, the lead frame 44 is described below. In the above example, the semiconductor circuit board 41 is electrically connected to the lead frame 44. To solve the difficulties as mentioned in Problem 6, however, the lead frame 44 is characterized by the formation of beam leads on the ordinary lead frame with bumps at tips of such beam leads.

Figures 11A, 11B, 11C:
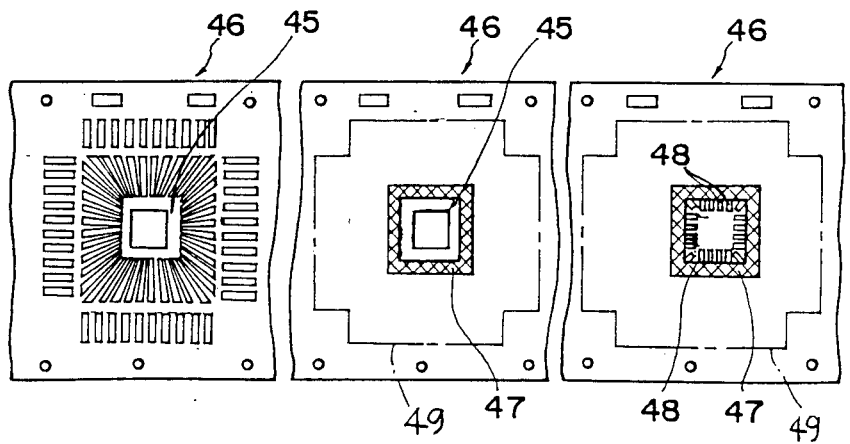
Figure 12:
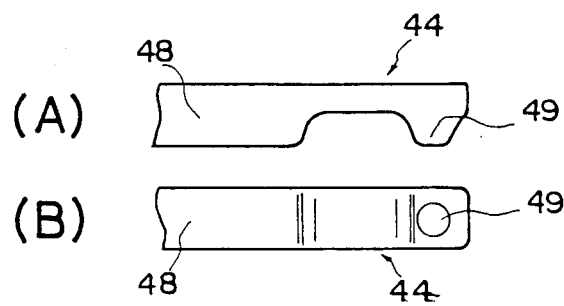

The above lead frame 44 is fabricated by the following procedure. A blank sheet made of copper alloy (t=0.15 mm) is stamped with a stamping die or etched to provide a frame member 46 leaving the central beam lead portion 45 still blank as shown in FIG. 11 (A). To provide protection of the beam lead portion 45, polyimide resin tape 47 is then bonded as shown in FIG. 11 (B). When the tape 47 is heated for thermal bonding, the lead frame material is heated to a temperature high enough to fully anneal the lead frame for complete removal of stresses therefrom. Otherwise, the minute pattern of beam leads as formed by etching at the process step of FIG. 11 (C) may be deformed by the residual stresses. Thus, the beam lead approach that has hitherto been limited to tape or the like is now applicable to the lead frame. Further, a metal pad, if applied on heating, suppresses heat conduction to the outer lead frame portion, limiting annealing to the necessary portion of the lead frame. The outer lead frame portion including the beam leads thus keeps its original mechanical strength high enough to allow satisfactory sealing of the semiconductor device in resin under pressure by the transfer mold process. In the next step of FIG. 11 (C), the beam leads 48 are formed by etching. It is noted that the pattern of the frame member 46 as shown in FIG. 11 (A) is omitted from illustration in an area enclosed with an interrupted line 46a in FIG. 11 (B) and (C) to avoid unduly cluttering the drawing in the area of the resin tape 47 and the beam leads 48 to facilitate understanding. At the process step of FIG. 11 (C), a bump 49 is formed at the tip of each beam lead as shown in FIG. 12 (A) and (B). In this example, the bumps are formed by plating with tin, copper or gold.

Figure 13:
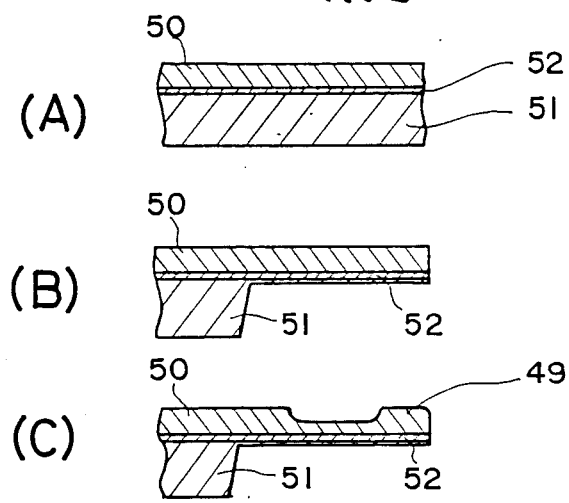
Figure 14:
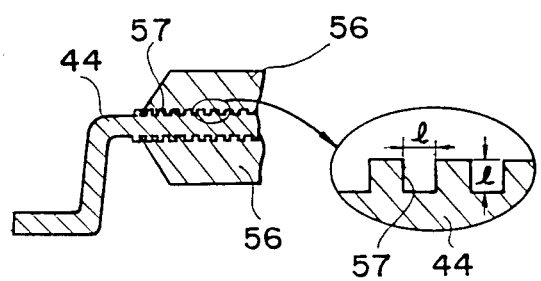

Alternatively, the so-called "clad frame" as shown in FIG. 13 (A) may be used for the lead,, frame material. For the copper foil 50 in the "clad frame" of FIG. 13 (A) electrolytic copper foil or the like may be used with favorable results. First, as shown in FIG. 13 (B), an unnecessary part of a copper alloy layer 51 provided on the copper foil 50 is removed. To avoid adverse effects on the copper foil 50 on such removal, it is preferred to use a clad frame material having an intermediate layer 52 made of chromium or the like that is formed by plating types of semiconductor device packages on a carrier tape 64 provided. Fine etching work then forms beam leads as shown in FIG. 13 (C).

Thus, the fabrication process as mentioned in the above example provides beam leads at a high density unattainable by prior art procedures. Further, the approach by using no bonding wire, is free from any problem associated with bonding wires, as for example, the deformation of such wires, thereby enabling a higher molding pressure to be employed during the process step where the semiconductor device is sealed in resin, resulting in an improved airtight performance of the semiconductor device package.

In the above fabrication process, it is noted that if the surface of inner leads is etched to have notches 57 sized as large as resin grains used for the sealing resin 53, for example, to a depth or width "1" of 30 to 80μm, the applied resin adheres more firmly to the lead frame, alleviating the problem of contact failure at the resin lead frame interface as already mentioned in Problem 7.

FIGS. 15 (A) through (F) are major steps of a process for fabricating a semiconductor device package with miniature semiconductor elements according to the above example.

First, at the step of FIG. 15 (A), a board 41 as shown in FIG. 7 is placed on to a table 58 and a lead frame 44 is placed thereon. A bonder head 59 is then applied to bond bumps 49 at the tip of beam leads 48 to the board 41 for beam lead bonding. At the step of FIG. 15 (B), a miniature semiconductor element 30 is then placed on the table 58 and the board 41 bonded to the beam leads 48 is placed on the semiconductor element 30 with the bumps 42 down. As the bonder head 59 is applied, these bumps 42 are pressed against the semiconductor element 30 for flip chip bonding. At the step of FIg. 15 (C), the whole assembly is turned upside-down and moistureproof resin 54 is fed from a nozzle 60 disposed above the assembly for potting. At the step of FIG. 15 (D), low stress resin 55 is fed form another nozzle 61 for potting. At the step of FIG. 15 (E), the potted assembly is turned upside-down to repeat potting on the reverse side of the assembly. At the step of FIG. 15 (F), inexpensive resin 56 is injected by the transfer mold process to complete resin sealing.

Figure 16:
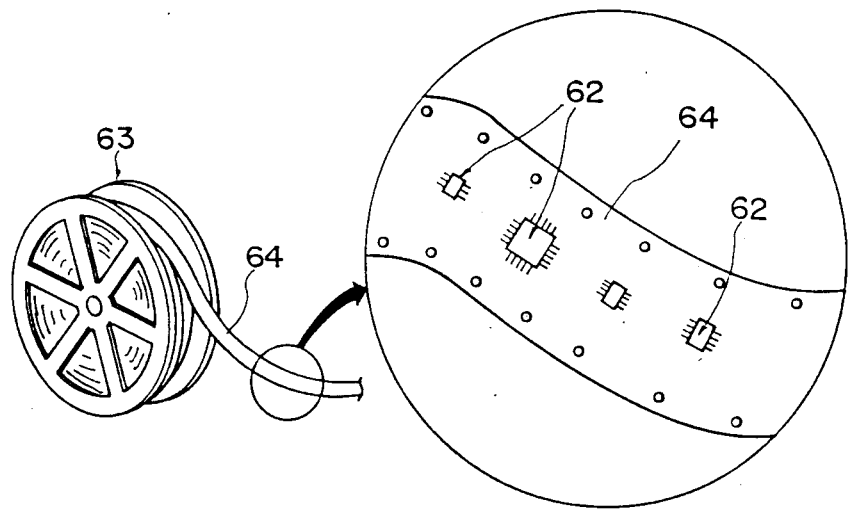

The semiconductor device that conforms to the above example can be packaged as FLP. As shown in FIG. 16, therefore, FLPs (as well as SOPs) of different types (linear type, digital type, and standard IC type) can be packaged in conformity to the example and stuck to carrier tape 64 according to specifications requested by the user to supply all types of semiconductor device packages on a carrier tape 64 provided from a single reel 63. Efficient packaging thus becomes possible since respective reels for each of the required semiconductor device package types are not necessary.

Figure 17:
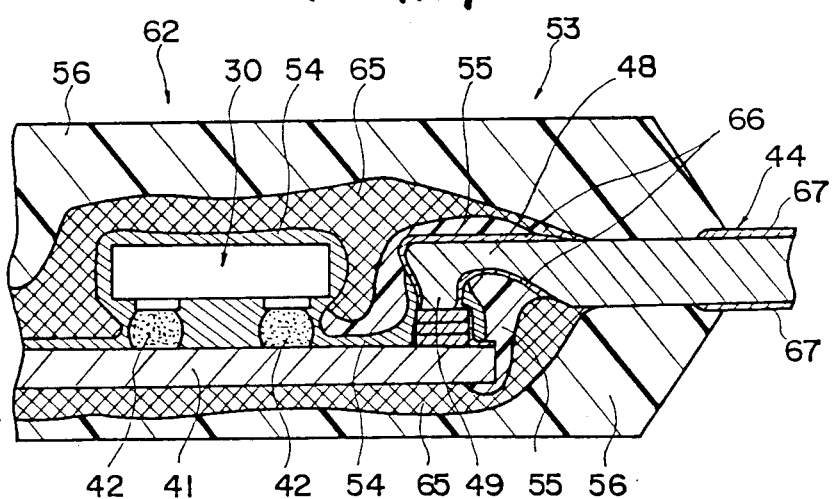

FIG. 17 is another example of the package construction embodying the invention. This example is essentially the same as the package construction of FIG. 6 except for a major difference in that heat conductive resin 65 is additionally used for coating low stress resin 55 which is applied at least to part of the surface of moistureproof resin 54 and particularly around the bump 49. The heat conductive resin 65 is applied so as to practically cover the surfaces of resin 54 and low stress resin 55. It is noted that surfaces of the lead frame 44 on the beam lead side are plated with gold 66 while those surfaces of the same lead frame that are covered with resin 56 are metallized with solder 67.

The approach as mentioned above making combined use of a plurality of resin types different in function makes it possible to apply an expensive high performance resin type or types rather thin in smaller amounts on a selective basis to cover the semiconductor element 30 and the bumps 49 of the beam leads and an inexpensive resin type that is inferior in performance as a thick outer cover in a larger amount. Thus the combined use of a plurality of resin types that provide,. needed functions separately for packaging gives is effective in producing a semiconductor device package of high reliability at low cost.

Further, in the above design of a semiconductor device package, bonding pads are provided at least in the active area of the respective semiconductor elements for wireless bonding thereof to a circuit board. An area wide enough to accommodate such bonding pads can thus be effectively provided on each semiconductor element, thereby facilitating circuit integration to a higher circuit density or reducing the chip size of the semiconductor element. Further, a more uniform array of bonding pads that can thereby be achieved improves productivity and enables stress to be avoided, resulting in higher reliability of the semiconductor device package and faster packaging at low cost.

Referring to FIGS. 18 through 25, there will be described other examples of the FLP type semiconductor device package 62 that modify the packaging method of the foregoing example.

Figure 18:
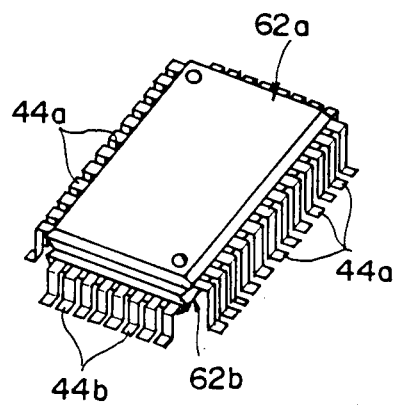
Figure 19:
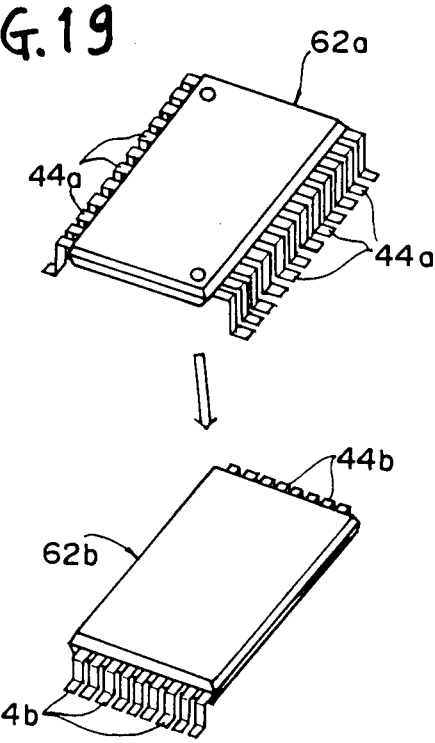
Figure 20:
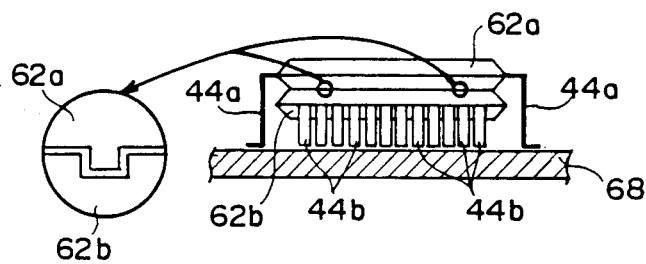

In the embodiment of FIGS. 18 through 20, two semiconductor devices 62a and 62b different in type are assembled one on the other to provide a stacked type semiconductor device package with the outer leads 44a from the upper device of longer length than the outer leads 44b from the lower device. The outer leads 44a and 44b can thus be bent to stand at the same level so the stacked package may be used as FLP. Further, two semiconductor devices, if stacked as above and mounted on a printed circuit board 68, provide a higher packaging density (number of pins) per unit area.

As shown in an enlarged illustration in FIG. 20, in the above modification, notches are provided on one side of the semiconductor device 62b while ridges are provided on one side of the semiconductor, device 62a to allow engagement of these two semiconductor devices in a given alignment registration. With these notches and ridges, the two devices can readily be positioned accurately relative to each other, preventing positional errors with respect to the outer leads thereof.

Figure 21:
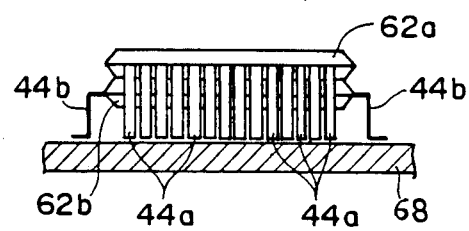
Figure 22:
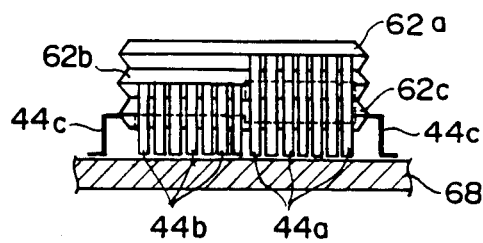

Further, the position of longer outer leads 44a can be changed as shown in FIG. 21 or three semiconductor devices 62a, 62b and 62c can be stacked as shown in FIG. 22 with outer leads from individual devices selectively extended.

Figure 23:
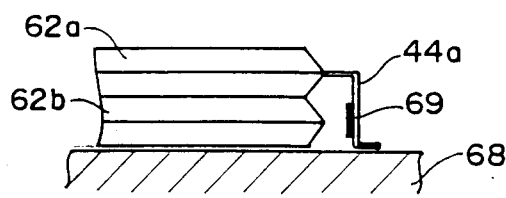

FIG. 23 is an example wherein adhesive tape 69, for example, made of polyimide resin is attached to the inside face of leads 44a for reinforcement, which effectively suppresses interference between leads 44a and device 62b in the region of the tape 69.

The, above stacked type semiconductor device package has an advantage in that the number of available pins can be increased. If the piggyback device configuration of the prior art is adopted with such package, electrical connections can be added between stacked devices.

Figure 24:
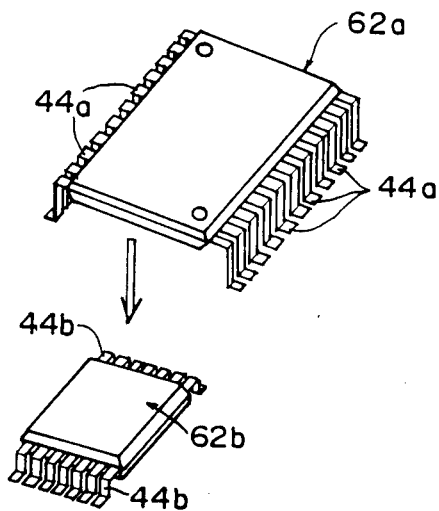

In another example of the stacked type semiconductor device package of the invention as shown in FIG. 24, the upper semiconductor device 62a is made larger in size than the lower one 62b so the latter may fit into the space defined by the former for assembly.

Figure 25:
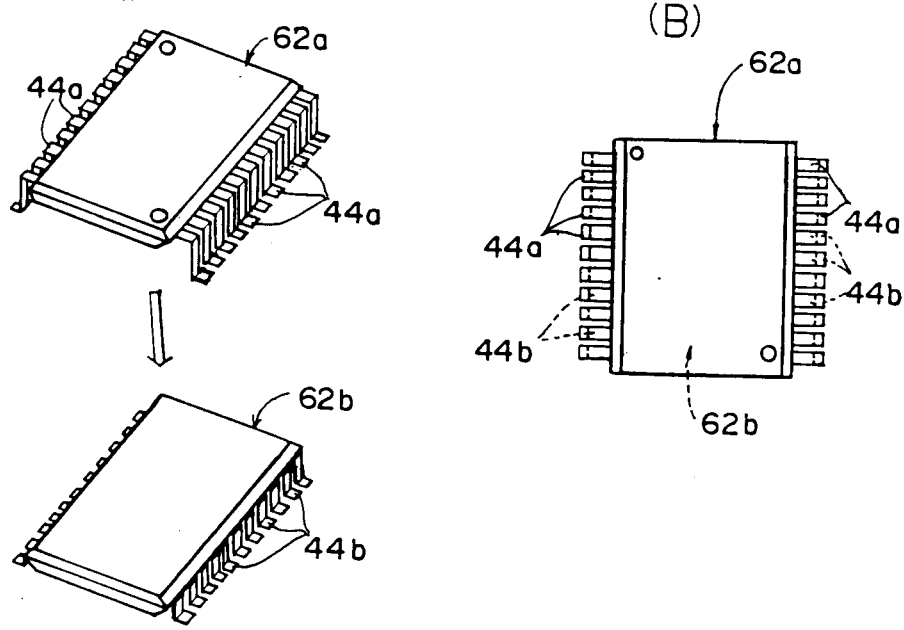

In FIG. 25, both the upper and lower semiconductor devices 62a and 62b have leads extending from the same sides though leads 44a from the upper semiconductor device 62a are made to extend laterally from the device 62a for a longer distance than the leads 44b from the lower semiconductor device 62b, so when a stacked type semiconductor device package is assembled from these semiconductor devices, both leads 44a and 44b can be fixed on a printed circuit board without any mutual interference.

It is noted that for the respective semiconductor devices 62a, 62b and 62c as mentioned in describing the stacked type semiconductor device packages, the semiconductor device as described with reference to FIGS. 6 through 10 may be used.

According to the above package construction, at least one of the stacked semiconductor devices has outer leads of longer length as compared to the outer leads of the remaining semiconductor device(s). Therefore, the outer leads may be formed in such a manner that the stacked type semiconductor device package may be practically used as an FLP. Furthermore, a stacked type semiconductor device package mounted on a printed circuit board enables a higher circuit density of circuit integration (a larger number of pins) to be achieved and provides a varied combination of semiconductor devices for various applications.

It will be evident that various modifications can be made to the described embodiments without departing from the scope of the present invention.

For example, bonding pads on the miniature semiconductor elements as mentioned above may be variously changed in position, number, size, etc. Further, bonding to the circuit board or the like may be achieved by a method other than as described. Sealing resins may also be changed in chemical species, coating method, etc. Though miniature semiconductor elements are mounted on the circuit board in face-down configuration, in the described examples ordinary semiconductor elements may be used and techniques of semiconductor fabrication technology other than as described may be applied to fabricate resistors, capacitors, etc. Furthermore, though only examples of an FLP package are provided as illustrations herein, the invention is not limited to the FLP type package but is also applicable, for example, to the PLCC (Plastic Chip Carrier) type package, PGA (Pin Grade Array) type package, etc.

What is claimed is:

1. A semiconductor device package comprising:

a circuit board having a plurality of electrical contact areas provided thereon and being provided with at least one component thereon for performing an electrical function;

a semiconductor chip disposed in vertical registration with said circuit board and having an electrically active region thereon for performing electrical functions;

a plurality of bonding pads provided at least in said electrically active region of said semiconductor chip, said bonding pads being in engagement with respective electrical contact areas on said circuit board for electrically connecting the electrically active region of said semiconductor chip to said circuit board;

a lead frame having an inner lead frame portion disposed about the periphery of said circuit board and being in engagement with respective contact areas on said circuit board so as to be electrically connected to said circuit board and to said semiconductor chip via said circuit board, said lead frame including an outer lead frame portion comprising a plurality of conductive leads respectively connected at one end thereof to the inner lead frame portion and extending outwardly with respect to said circuit board and said semiconductor chip;

resin means encapsulating said circuit board, said semiconductor chip, and the inner lead frame portion of said lead frame to provide a wireless hermetically sealed package; and said conductive leads of said outer lead frame portion being disposed outwardly of said encapsulating resin means.

2. A semiconductor device package as set forth in claim 1, wherein at least some of said electrical contact areas on said circuit board are bump electrodes projecting upwardly from said circuit board; and said bonding pads on said semiconductor chip being in engagement with said bump electrodes provided on said circuit board.

3. A semiconductor device package as set forth in claim 2, wherein said plurality of bonding pads on said semiconductor chip are arranged in a matrix of rows and columns of bonding pads in the electrically active region of said semiconductor chip.

4. A semiconductor device package as set forth in claim 3, further including a moisture-resistant metal coating disposed on each of said plurality of bonding pads.

5. A semiconductor device package as set forth in claim 1, wherein each of said semiconductor chip and said circuit board comprises the same chemical species of semiconductor material; and said circuit board including additional circuit elements formed thereon for operation in conjunction with the electrically active region of said semiconductor chip.

6. A semiconductor device package as set forth in claim 1, wherein said resin means comprises a plurality of different resins having different functions disposed on said semiconductor chip in coating relationship thereabout, said plurality of different resins including:

a thin layer of moisture-proof resin coating said semiconductor chip, a thin layer of low stress resin covering said layer of moisture-proof resin, and an outer layer of resin covering said layer of low stress resin;

said outer layer of resin being relatively inexpensive as compared to the thin layers of moisture-proof resin and low stress resin; said outer layer of resin being relatively thick in relation to the thin layers of moisture-proof resin and low stress resin.

7. A semiconductor device package as set forth in claim 6, wherein said low stress resin is disposed at least around the connection end of individual conductive leads of the outer lead frame portion to the inner lead frame portion of said lead frame.

8. A semiconductor device package as set forth in claim 2, wherein said inner lead frame portion comprises a plurality of beam leads in engagement with respective contact areas on said circuit board.

9. A semiconductor device package as set forth in claim 8, further including conductive bumps on each of said beam leads of said inner lead frame portion projecting therefrom; and said conductive pumps of said beam leads being in engagement with respective contact areas on said circuit board.

10. A semiconductor device package as set forth in claim 9, wherein said lead frame comprises a main metallic body portion, a metallic foil layer covering said metallic body portion, and an intermediate metallic reinforcing layer interposed between said main metallic body portion and said metallic foil portion;

said metallic foil portion and said metallic reinforcing layer extending inwardly of said main metallic body portion of said lead frame in defining said beam leads of said inner lead frame portion with said conductive bumps of said beam leads being formed in said metallic foil layer.

11. A semiconductor device package as set forth in claim 3, wherein said lead frame is provided with a plurality of notches int eh inner lead frame portion thereof encapsulated by said resin means; and said notches in said inner lead frame portion being respectively of a size comparable to the size of individual resin grains of said encapsulating resin means for enhancing adherence of said encapsulating resin to said lead frame.

12. A semiconductor device package as set forth in claim 11, wherein said inner lead frame portion comprises a plurality of beam leads in engagement with respective contact areas on said circuit board.

13. A semiconductor device package as set forth in claim 12, further including conductive bumps on each of said beam leads of said inner lead frame portion projecting therefrom; and said conductive bumps of said beam leads being in engagement with respective contact areas on said circuit board.

* * * * *